United States Patent
Zhou et al.

(10) Patent No.: US 9,564,235 B2
(45) Date of Patent: Feb. 7, 2017

(54) TRIMMABLE REFERENCE GENERATOR FOR SENSE AMPLIFIER

(71) Applicant: Silicon Storage Technology, Inc., San Jose, CA (US)

(72) Inventors: Yao Zhou, Shanghai (CN); Xiaozhou Qian, Shanghai (CN); Kai Man Yue, Shanghai (CN); Guangming Lin, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/386,814

(22) PCT Filed: Mar. 15, 2013

(86) PCT No.: PCT/US2013/032489
§ 371 (c)(1),
(2) Date: Sep. 22, 2014

(87) PCT Pub. No.: WO2013/148357
PCT Pub. Date: Oct. 3, 2013

(65) Prior Publication Data
US 2015/0078081 A1    Mar. 19, 2015

(30) Foreign Application Priority Data

Mar. 30, 2012 (CN) .......................... 201210089847

(51) Int. Cl.
| | |
|---|---|
| G11C 16/04 | (2006.01) |
| G11C 16/26 | (2006.01) |
| G11C 16/28 | (2006.01) |
| G11C 7/14 | (2006.01) |
| G11C 29/02 | (2006.01) |

(52) U.S. Cl.
CPC ............... *G11C 16/26* (2013.01); *G11C 7/14* (2013.01); *G11C 16/28* (2013.01); *G11C 29/021* (2013.01); *G11C 29/026* (2013.01); *G11C 29/028* (2013.01)

(58) Field of Classification Search
CPC ............................. G11C 16/26; G11C 16/28
USPC ..................................................... 365/185.2
See application file for complete search history.

(56) References Cited

U.S. PATENT DOCUMENTS

| | | | |
|---|---|---|---|
| 6,163,483 A * | 12/2000 | Pasotti | G11C 16/12 365/185.19 |
| 7,185,245 B2 | 2/2007 | Dirscherl | |
| 7,649,781 B2 | 1/2010 | Syzdek | |
| 7,773,445 B2 * | 8/2010 | Pagano | G11C 7/062 365/210.11 |
| 2004/0085812 A1 | 5/2004 | Frayer | |

(Continued)

FOREIGN PATENT DOCUMENTS

| | | |
|---|---|---|
| JP | 2001-229686 | 8/2001 |
| JP | 2002-251893 | 9/2002 |

(Continued)

OTHER PUBLICATIONS

Japanese Office Action dated Sep. 24, 2015 corresponding to the related Japanese Patent Application No. 2015-503341.

(Continued)

*Primary Examiner* — Son Mai
(74) *Attorney, Agent, or Firm* — DLA Piper LLP (US)

(57) ABSTRACT

A trimmable current reference generator for use in a sense amplifier is disclosed.

20 Claims, 4 Drawing Sheets

(56) References Cited

U.S. PATENT DOCUMENTS

| | | |
|---|---|---|
| 2005/0078537 A1 | 4/2005 | So et al. |
| 2005/0162931 A1 | 7/2005 | Portmann et al. |
| 2007/0247892 A1 | 10/2007 | Egerer |
| 2008/0043525 A1 | 2/2008 | Syzdek et al. |
| 2009/0080267 A1 | 3/2009 | Bedeschi et al. |

FOREIGN PATENT DOCUMENTS

| | | |
|---|---|---|
| JP | 2007-005771 | 1/2007 |
| JP | 2008-052841 | 3/2008 |
| JP | 2010-282987 | 12/2010 |
| WO | 2010 082243 A1 | 7/2010 |

OTHER PUBLICATIONS

PCT Search Report and Written Opinion dated Jun. 19, 2013 corresponding to the related PCT Patent U.S. Appl. No. 13/032,489.

* cited by examiner

US 9,564,235 B2

TRIMMABLE REFERENCE GENERATOR FOR SENSE AMPLIFIER

TECHNICAL FIELD

A trimmable current reference generator for use in a sense amplifier is disclosed.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

Read operations usually are performed on floating gate memory cells using sense amplifiers. A sense amplifier for this purpose is disclosed in U.S. Pat. No. 5,386,158 (the "'158 Patent"), which is incorporated herein by reference for all purposes. The '158 Patent discloses using a reference cell that draws a known amount of current. The '158 Patent relies upon a current mirror to mirror the current drawn by the reference cell, and another current mirror to mirror the current drawn by the selected memory cell. The current in each current mirror is then compared, and the value stored in the memory cell (e.g., 0 or 1) can be determined based on which current is greater.

Another sense amplifier is disclosed in U.S. Pat. No. 5,910,914 (the "'914 Patent"), which is incorporated herein by reference for all purposes. The '914 Patent discloses a sense circuit for a multi-level floating gate memory cell, which can store more than one bit of data. It discloses the use of multiple reference cells that are utilized to determine the value stored in the memory cell (e.g., 00, 01, 10, or 11). Current mirrors are utilized in this approach as well.

An alternative to using reference cells is to use a reference current. The reference current is used to determine the value stored in the memory cell. This is a known technique in the prior art. However, one drawback of this approach is that if the same reference circuit is used for each memory cell within a semiconductor die, the temperature variations within the die during normal operation or variations during processing will cause the reference currents to vary throughout the die.

What is needed is an improved sensing circuit that utilizes a current reference signal, where the signal can be adjusted to account for temperature variations and process variations that occur within a semiconductor die.

SUMMARY OF THE INVENTION

The aforementioned problems and needs are addressed by providing a trimmable reference generator for a sense amplifier. In one embodiment, the reference generator comprises a variable resistor that is adjusted during the manufacturing process to optimize the operation of the sense amplifier for its particular thermal and device characteristics, based, for example, on its location within the die.

Other objects and features of the present invention will become apparent by a review of the specification, claims and appended figures.

DETAILED DESCRIPTION OF THE PREFERRED EMBODIMENTS

Figure 1:
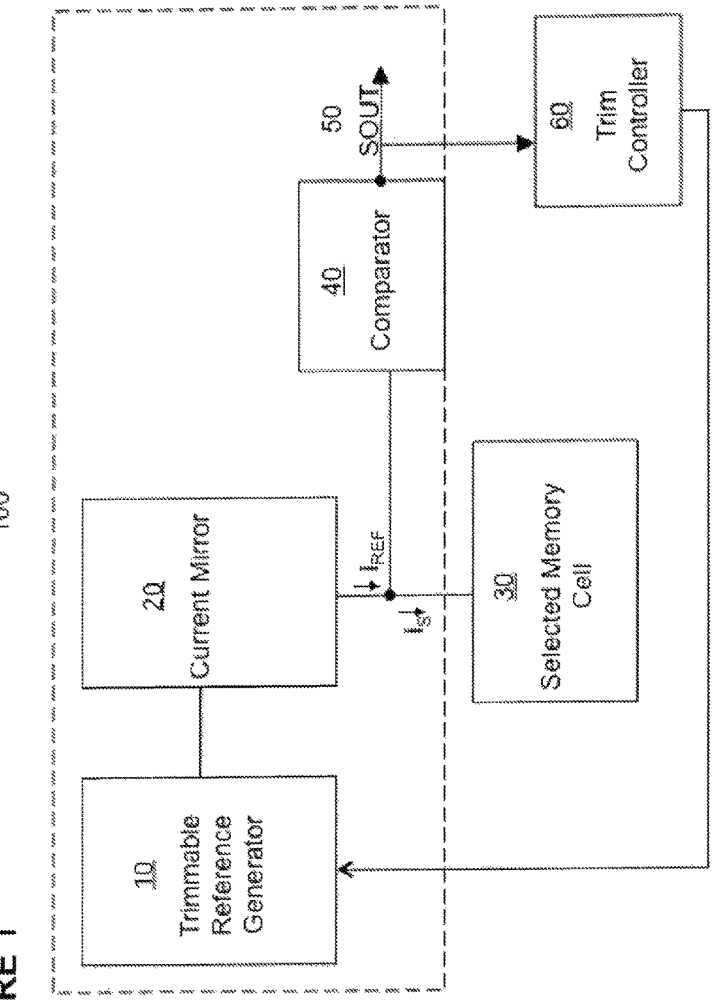
FIG. 1 is an exemplary block diagram of a sensing circuit embodiment that comprises a trimmable current reference generator.

An embodiment will now be described with reference to FIG. 1. Sense amplifier 100 comprises trimmable reference generator 10, current mirror 20, comparator 40, comparator output 50, and trim controller 60. Trimmable reference generator 10 is coupled to current mirror 20, such that current mirror 20 will generate the same amount of current as trimmable reference generator 10, $i_{REF}$. Current mirror 20 is coupled to comparator 40 and selected memory cell 30. Selected memory cell 30 will draw a certain amount of current, $i_S$, that is related to the value that is stored in selected memory cell 30. For example, if selected memory cell 30 is storing a "0," $i_S$ will normally be close to 0 amps. If selected memory cell 30 is storing a "1," $i_S$ will be greater than 0 amps (for example, 1 mA). Comparator 40 will compare $i_{REF}$ and $i_S$. If $i_S > i_{REF}$, then comparator output 50 will be "0." If $i_S < i_{REF}$, then comparator output 50 will be "1." Thus, comparator output 50 represents the inverted value of the data stored in selected memory cell 30. Optionally, output 50 can be sent through an inverter to create the value stored in selected memory cell 30. Trim controller 60 is coupled to comparator output 50. That coupling optionally can be present only during the trim process (such as through a switch).

Selected memory cell 30 comprises one memory cell within an array of memory cells. Selected memory cell 30 can be selected for a read operation using a row line and column line, as is well-known to those of ordinary skill in the art. An example of the type of cell that can be used as selected memory cell 30 is explained in U.S. Pat. No. 7,868,375, which is incorporated herein by reference for all purposes. That patent discloses a type of cell called a split gate non-volatile memory cell. One of skill in the art will appreciate that certain types of memory cells can hold one of two different values (e.g., "0" or "1") and others can hold one of four different values (e.g., "00," "01," "10," and "11), or even more than four different values.

Figure 2:
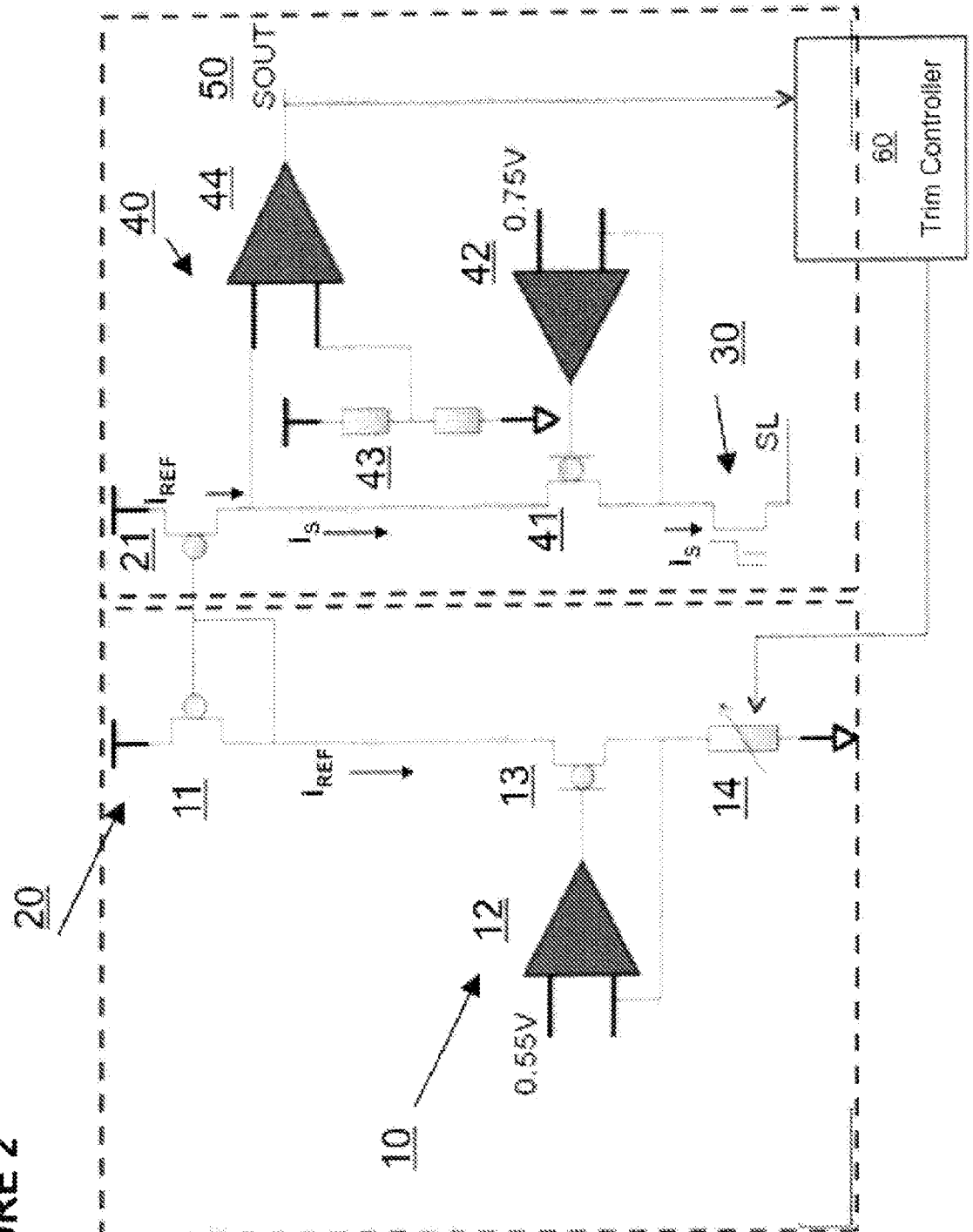
FIG. 2 is an exemplary circuit diagram of a sensing circuit embodiment that comprises a trimmable current reference generator.

FIG. 2 shows an embodiment at the circuit level of the design shown in FIG. 1. Trimmable reference generator 10 comprises operational amplifier 12, NMOS transistor 13, and variable resistor 14. The drain of PMOS transistor 11 is the source of NMOS transistor 13. The gate of NMOS transistor 13 is coupled to the output of operational amplifier 12, which here is acting as a comparator. Operational amplifier 12 is a voltage input amplifier and does not consume input current. The non-inverting input of operational amplifier 12 is tied to a voltage source of 0.55 V in this example, and the inverting input of operational amplifier 12 is coupled to the source of NMOS transistor 13, which in turn is connected to variable resistor 14. Trimmable reference generator 10 generates current $i_{REF}$. Operational amplifier 42 and NMOS transistor 41 act as a clamp loop for the $i_{REF}$ current.

Current mirror 20 comprises PMOS transistor 11 and PMOS transistor 21. The gate of PMOS transistor 11 is coupled to its drain as well as the gate of PMOS transistor 21. The drain of PMOS transistor 21 is the source of NMOS transistor 41. The gate of NMOS transistor 41 is the output of operational amplifier 42, which here is acting as a comparator. Operational amplifier 42 is a voltage input amplifier and does not consume input current. The non-inverting input of operational amplifier 42 is tied to a voltage source of 0.75 V in this example. The inverting input of operational amplifier 42 is tied to the input of selected memory cell 30. Operational amplifier 42 and NMOS transistor 41 act as a clamp loop for selected memory cell 30.

Comparator 40 comprises operational amplifier 44 and voltage divider 43. The drain of PMOS transistor 21 also is the non-inverting input of operational amplifier 44, which here is acting as a comparator. Operational amplifier 44 is a voltage input amplifier and does not consume input current. The inverting input of operational amplifier 40 is tied to a fixed voltage generated by voltage divider 43. The output of operational amplifier 40 is comparator output 50.

PMOS transistor 21 emits a current of $i_{REF}$, due to the fact that it is part of current mirror 20. Selected cell 30 draws current $i_S$, and the drain of NMOS transistor 41 also will draw a current $i_S$. If $i_{REF} > i_S$, then the non-inverting input of operational amplifier 44 will be high. If $i_{REF} < i_S$, then the non-inverting input of operational amplifier 44 will be low.

In operation, if selected memory cell 30 is storing a "0," then $i_S$ will be close to 0 A. If variable resistor 14 is properly set (as discussed below), then $i_{REF}$ will be greater than $i_S$, and the non-inverting input of operational amplifier 44 therefore will be high, and operational amplifier 44 will emit a high voltage (i.e., a "1"), which is an inverted value of the data stored in selected memory cell 30.

If selected memory cell 30 is storing a "1," then $i_S$ will be relatively high. If variable resistor 14 is proper set (again, as discussed below), then $i_{REF}$ will be less than $i_S$, and the non-inverting input of operational amplifier 44 therefore will be low, and operational amplifier 44 will emit a low voltage (i.e., a "0"), which is an inverted value of the data stored in selected memory cell 30.

With reference to FIGS. 1 and 2, a self-trim embodiment will be described.

Trim controller 60 monitors comparator output 50 and controls the resistance of variable resistor 14. Regardless of the data that is stored in selected memory cell 30, trim controller 60 can determine the optimum level of resistance of variable resistor 14 by increasing the amount of resistance in variable resistor 14 until comparator output 50 changes. That level of resistance is recorded by trim controller 60, and thereafter, during read operations, variable resistor 14 is set to that optimum level of resistance. If comparator output 50 does not change, then the level of resistance of variable resistor 14 is decreased until comparator output 50 changes That level of resistance is recorded by trim controller 60, and thereafter, during read operations, variable resistor 14 is set to that optimum level of resistance.

Optionally, this process can be performed a plurality of times, optionally with different values stored in selected cell 30, and trim controller 60 can determine the average of the various resistance levels identified that caused comparator output 50 to change, and trim controller 60 then can store the average value to be used during read operations.

Optionally, the resistance of variable resistor 14 can be permanently set by fuse, specifically, by blowing a certain combination of fuses to set the resistance at the desired level (in instances where variable resistor 14 follows such a design).

Figure 3:
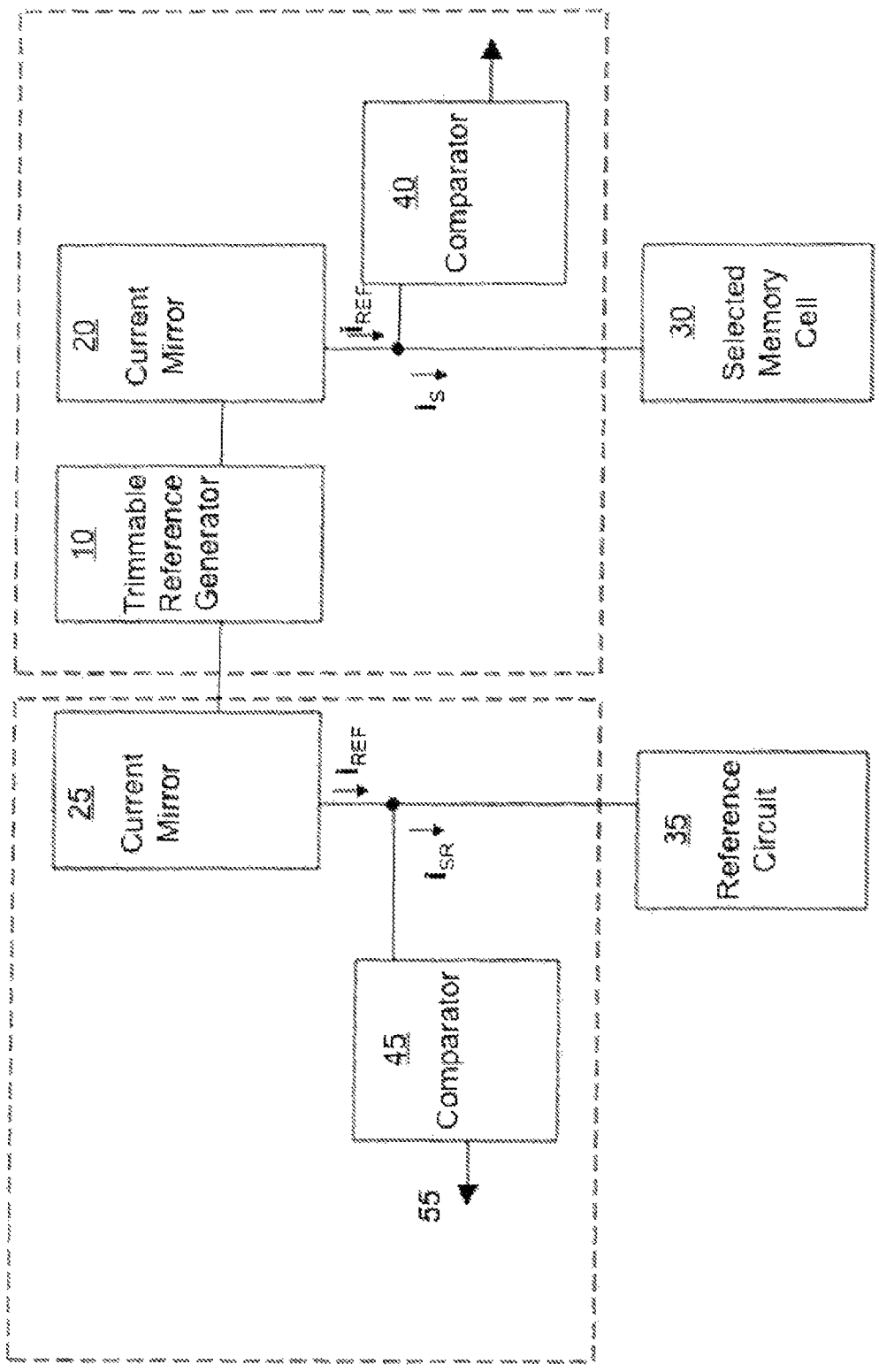
FIG. 3 is an exemplary block diagram of a test circuit embodiment that can be used to set a variable resistor in a trimmable current reference generator.
Figure 4:
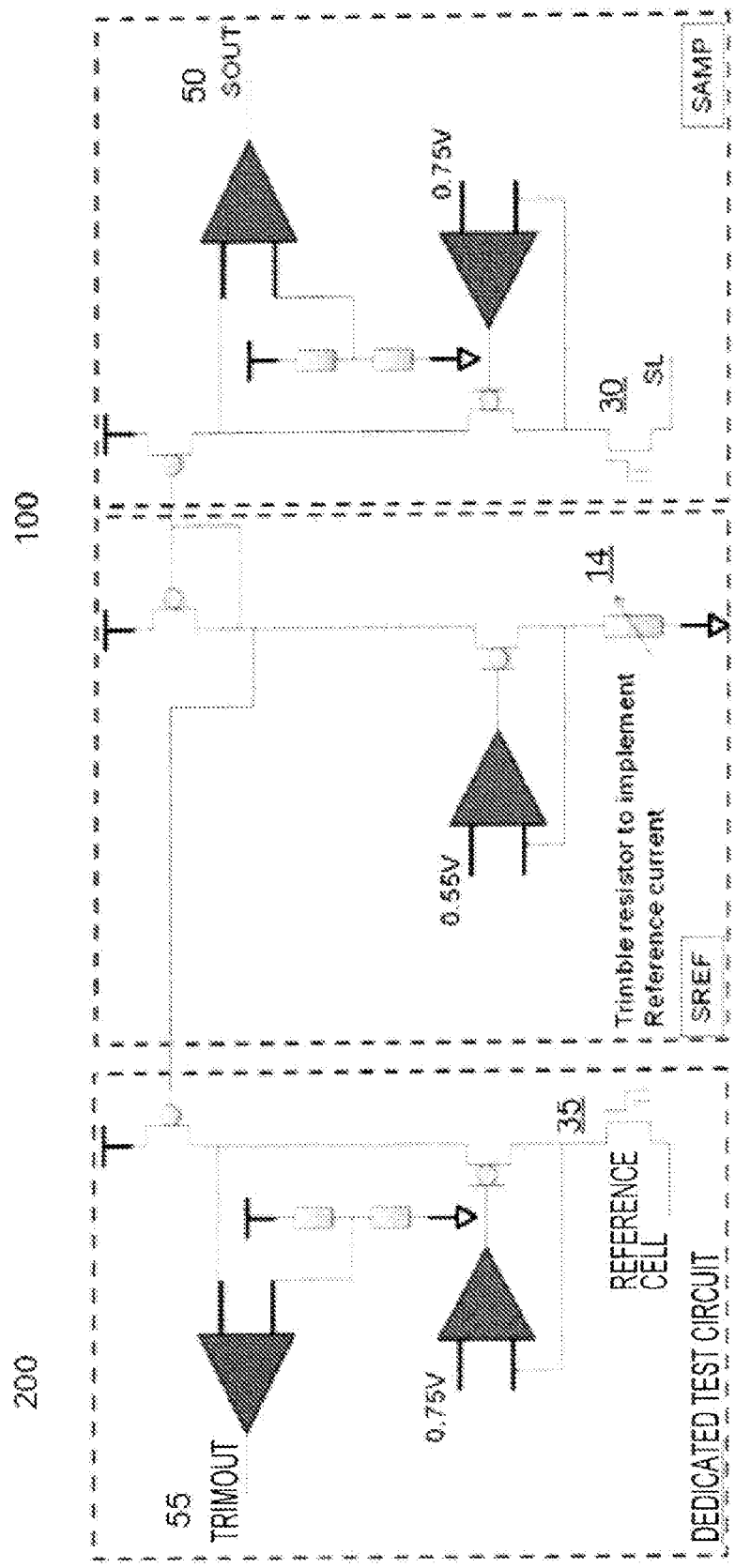
FIG. 4 is an, exemplary circuit diagram of a test circuit embodiment that can be used to set a variable resistor in a trimmable current reference generator.

With reference to FIGS. 3 and 4, a different embodiment for trimming a sense amplifier is described. FIG. 3 depicts the embodiment at a block diagram level, and FIG. 4 depicts the same embodiment at a circuit level. Test circuit 200 is used to set variable resistor 14. Test circuit 200 comprises current mirror 25 (identical in structure to current mirror 20), comparator 45 (identical in structure to comparator 40), and reference circuit 35. Reference circuit 35 draws current $i_{SR}$. Reference circuit 35 comprises a reference cell designed to draw a set level of current, $i_{SR}$, to provide read "trip points" to help determine whether a selected memory cell is storing a "1" or "0." Optionally, the same test circuit 200 can be used during the manufacturing or configuration process to test each instance of trimmable current reference generator 10 that is contained on a die and to set the resistance of each variable resistor 14 in each trimmable current reference generator 10. In a memory array, it is expected in most cases that there will be one current reference generator 10 for each memory cell contained on the die.

Variable resistor 14 should be set to a level that ensures that the data stored in selected memory cell 30 during operation is accurately reflected in output 50 in inverted form. One way to do this is to start with a relatively low resistance for variable resistor 14 during the trim process. This will cause $i_{REF}$ to be relatively high, which will mean $i_{REF}$ will be greater than $i_{SR}$ and comparator output 55 will emit a "1" (which would indicate a "0" stored in reference circuit 35), which is an incorrect result, since by definition, reference circuit 35 is containing neither a "1" or a "0."

Variable resistor 14 can then be set to increasing levels of resistance, which will cause $i_{REF}$ to decrease, until comparator output 55 becomes a "0." Optionally, this level of resistance is recorded (such as in a register), and thereafter, that value is used to set the resistance of variable resistor 14 for that particular trimmable current reference generator 10. This is the desired level of resistance because it reflects the reality that reference circuit 35 is storing a value between a "0" and a "1." Optionally, the resistance of variable resistor 14 can be permanently set by fuse, specifically, by blowing a certain combination of fuses to set the resistance at the desired level (in instances where variable resistor 14 follows such a design).

The description of FIGS. 1-4 heretofore have described selected memory cell 30 as storing one of two values (e.g., a "0" or a "1.") However, it can be appreciated that memory cells are capable of storing one of four or more values (e.g., a "00," "01," "10," or "11"). In such instances, multiple current reference generators 10 can be used. For example, if memory cells that can store one of four values is used, then three current reference generators 10 can be used, each set to a different level of current. The current drawn by selected memory cell 30 then can be compared against each of these three current reference generators 10 using three instances of the design shown in FIGS. 1-4, resulting in three different comparator outputs 50. These three outputs 50 can be decoded to indicate the value stored in selected memory cell 30. It will be appreciated by those of skill in the art that this design can be scaled to accommodate the number of possible values that selected memory cell 30 can store (e.g., 2 levels, 4 levels, 8 levels, etc.).

Thus, using these embodiments, a trimmable reference generator is provided that can be trimmed to account for variations that naturally occur across a semiconductor die for each instance of the trimmable reference generator, which for a memory device is contemplated to number in the millions or billions.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. An apparatus for use in a memory device, comprising:
   a trim controller;
   a trimmable current reference generator for outputting a reference current;
   one or more selected memory cells; and
   a comparator for comparing the reference current with the current drawn by the one or more selected memory cells to generate an output indicative of a value stored in the selected memory cell,
   wherein the trim controller monitors output of the comparator, controls the resistance of a variable resistor, and determines the optimum level of resistance of the variable resistor.

2. The apparatus of claim 1, wherein the selected memory cell is a split gate non-volatile memory cell.

3. The apparatus of claim 2, wherein the selected memory cell can store one of two different values.

4. The apparatus of claim 2, wherein the selected memory cell can store one of four different values.

5. The apparatus of claim 1, wherein the trimmable current reference generator comprises a variable resistor.

6. The apparatus of claim 2, wherein the trimmable current reference generator comprises a variable resistor.

7. The apparatus of claim 3, wherein the trimmable current reference generator comprises a variable resistor.

8. The apparatus of claim 4, wherein the trimmable current reference generator comprises a variable resistor.

9. The apparatus of claim 1, further comprising a current mirror.

10. A method of generating a reference to read one or more selected memory cells, comprising:
    generating current using a trimmable current reference generator;
    drawing current using one or more selected memory cells;
    comparing the current generated by the trimmable current reference generator with the current drawn by the one or more selected memory cells; and
    determining the optimum level of resistance of a variable resistor by increasing the amount of resistance in the variable resistor until a comparator output changes.

11. The method of claim 10, wherein the selected memory cell is a split gate non-volatile memory cell.

12. The method of claim 11, wherein the selected memory cell can store one of two different values.

13. The method of claim 11, wherein the selected memory cell can store one of four different values.

14. The method of claim 10, wherein the trimmable current reference generator comprises a variable resistor.

15. The method of claim 11, wherein the trimmable current reference generator comprises a variable resistor.

16. The method of claim 12, wherein the trimmable current reference generator comprises a variable resistor.

17. The method of claim 13, wherein the trimmable current reference generator comprises a variable resistor.

18. The method of claims 10, wherein the method of generating a reference to read one or more selected memory cells further comprises determining the average of the various resistance levels identified that caused comparator output to change.

19. The method of claim 18, wherein the method of generating a reference to read one or more selected memory cells further comprises storing the average value to be used during read operations.

20. The method of claim 10, wherein the method of generating a reference to read one or more selected memory cells further comprises recording a level of resistance.

* * * * *